United States Patent
Chen

(10) Patent No.: US 8,525,586 B2
(45) Date of Patent: Sep. 3, 2013

(54) GAIN STAGE WITH DC OFFSET COMPENSATION AND METHOD THEREOF

(75) Inventor: Mu-Jung Chen, Hsinchu County (TW)

(73) Assignee: Mediatek Inc., Science-Based Industrial Park, Hsin-Chu (TW)

( * ) Notice: Subject to any disclaimer, the term of this patent is extended or adjusted under 35 U.S.C. 154(b) by 155 days.

(21) Appl. No.: 13/210,348

(22) Filed: Aug. 15, 2011

(65) Prior Publication Data

US 2013/0043943 A1    Feb. 21, 2013

(51) Int. Cl.
*H03F 1/02*   (2006.01)

(52) U.S. Cl.
USPC .................................. 330/9; 330/254; 330/278

(58) Field of Classification Search
USPC ............................. 330/9, 254, 278; 455/232.1
See application file for complete search history.

(56) References Cited

U.S. PATENT DOCUMENTS

| 7,271,649 | B2 | 9/2007 | Chiu |
| 7,348,838 | B2 | 3/2008 | Ranganathan |

FOREIGN PATENT DOCUMENTS

| CN | 1716929 | 1/2006 |

*Primary Examiner* — Patricia Nguyen
(74) *Attorney, Agent, or Firm* — Winston Hsu; Scott Margo

(57) ABSTRACT

A gain stage with DC offset compensation includes a gain amplifier and a compensation device. The gain amplifier is arranged to amplify an input signal according to a gain control signal. The compensation device is arranged to perform a DC offset compensation applied to the gain amplifier with an operating configuration based on the gain control signal.

16 Claims, 8 Drawing Sheets

GAIN STAGE WITH DC OFFSET COMPENSATION AND METHOD THEREOF

BACKGROUND

The present invention relates generally to DC offset compensation, and more particularly, to a gain stage with DC offset compensation.

Communications receivers often suffer from interference due to a variety of factors, one of which is direct current (DC) offset. DC offset is usually undesirable since it may cause saturation or changes in the operating point of an amplifier of the receiver, especially when the amplifier operates with a relatively high gain. Conventionally, a DC offset canceller is one effective way to remove the DC offset interference.

Although the DC offset canceller can remove the DC offset interference under most conditions, the DC offset canceller disadvantageously brings further noise to the amplifier, which is especially unfavorable for noise-sensitive applications, such as an intermediate frequency (IF) gain stage of a frequency modulation (FM) receiver.

A gain stage of an FM receiver is schematically illustrated in FIG. 1. The gain stage 100 comprises a gain amplifier 110 and a DC offset canceller 120. The gain amplifier 110 varies its gain based on a gain control signal S_Gain (which is used to adjust variable components to vary the gain), and accordingly amplifies an input IN of the gain amplifier 110. The DC offset canceller 120 detects DC offset at the output OUT of the gain amplifier 110 and accordingly generates a compensation signal S_C which is fed back to the input IN of the gain amplifier 110 to cancel the DC offset. Since the DC offset canceller 120 needs to cover any possible DC offset, it is necessary to design the DC offset canceller 120 to have capability of providing a compensation amount whose maximum value is sufficient for any possible DC offset. As mentioned above, however, the DC offset canceller 120 disadvantageously brings further noise to the gain amplifier 110. If the DC offset canceller 120 is designed to provide a compensation amount having a larger maximum value than necessary (e.g. when the gain amplifier 110 is operated with a relatively low gain, the DC offset will be relatively low), the DC offset canceller 120 will unnecessarily interfere with the gain amplifier 110 since the cancellation of the DC offset does not need such a large compensation amount. This means the DC offset canceller 120 will affect the gain amplifier 110 with unnecessary noise.

Accordingly, there is a need in the art for a DC offset canceller that can alleviate noise caused to the amplifier.

SUMMARY

According to one embodiment of the present invention, a gain stage with DC offset compensation is provided which includes a gain amplifier and a compensation device. The gain amplifier is arranged to amplify an input signal according to a gain control signal. The compensation device is arranged to perform a DC offset compensation applied to the gain amplifier with an operating configuration based on the gain control signal.

According to another embodiment of the present invention, a method is provided to amplify an input signal. The method includes the steps of utilizing a gain amplifier to amplify the input signal according to a gain control signal; and performing a DC offset compensation applied to the gain amplifier based on the gain control signal.

According to still another embodiment of the present invention, a gain stage with DC offset compensation is provided which includes a gain amplifier and a compensation device. The gain amplifier is arranged to amplify an input signal according to a gain control signal. The compensation device is arranged to perform a DC offset compensation applied to the gain amplifier, which includes a first digital-to-analog converter (DAC) and a second DAC. The first digital-to-analog converter (DAC) is arranged to generate a first compensation signal for the DC offset compensation. The second DAC is selectively enabled according to the gain control signal, and arranged to generate a second compensation signal for the DC offset compensation when enabled.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the following descriptions and claims to refer to particular system components. As one skilled in the art will appreciate, manufacturers may refer to a component by different names. This document does not intend to distinguish between components that differ in name but not differ in functionality. In the following discussion and in the claims, the terms "include", "including", "comprise", and "comprising" are used in an open-ended fashion, and thus should be interpreted to mean "including, but not limited to . . . " The terms "couple" and "coupled" are intended to mean either an indirect or a direct electrical connection. Thus, if a first device couples to a second device, that connection may be through a direct electrical connection, or through an indirect electrical connection via other devices and connections.

Figure 1:
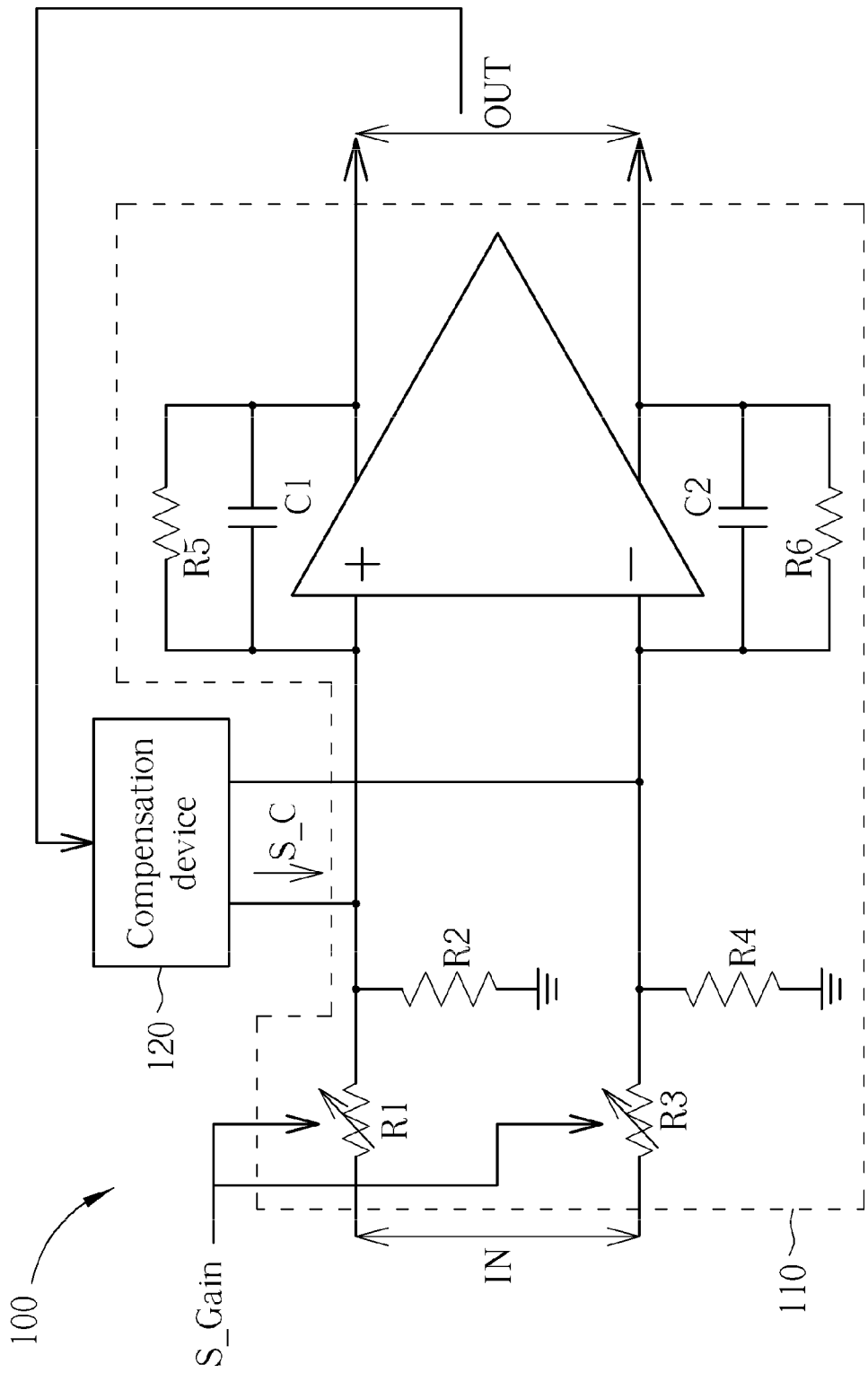
FIG. 1 is a simplified block diagram of a gain stage with DC offset compensation according to the related art.
Figure 2:
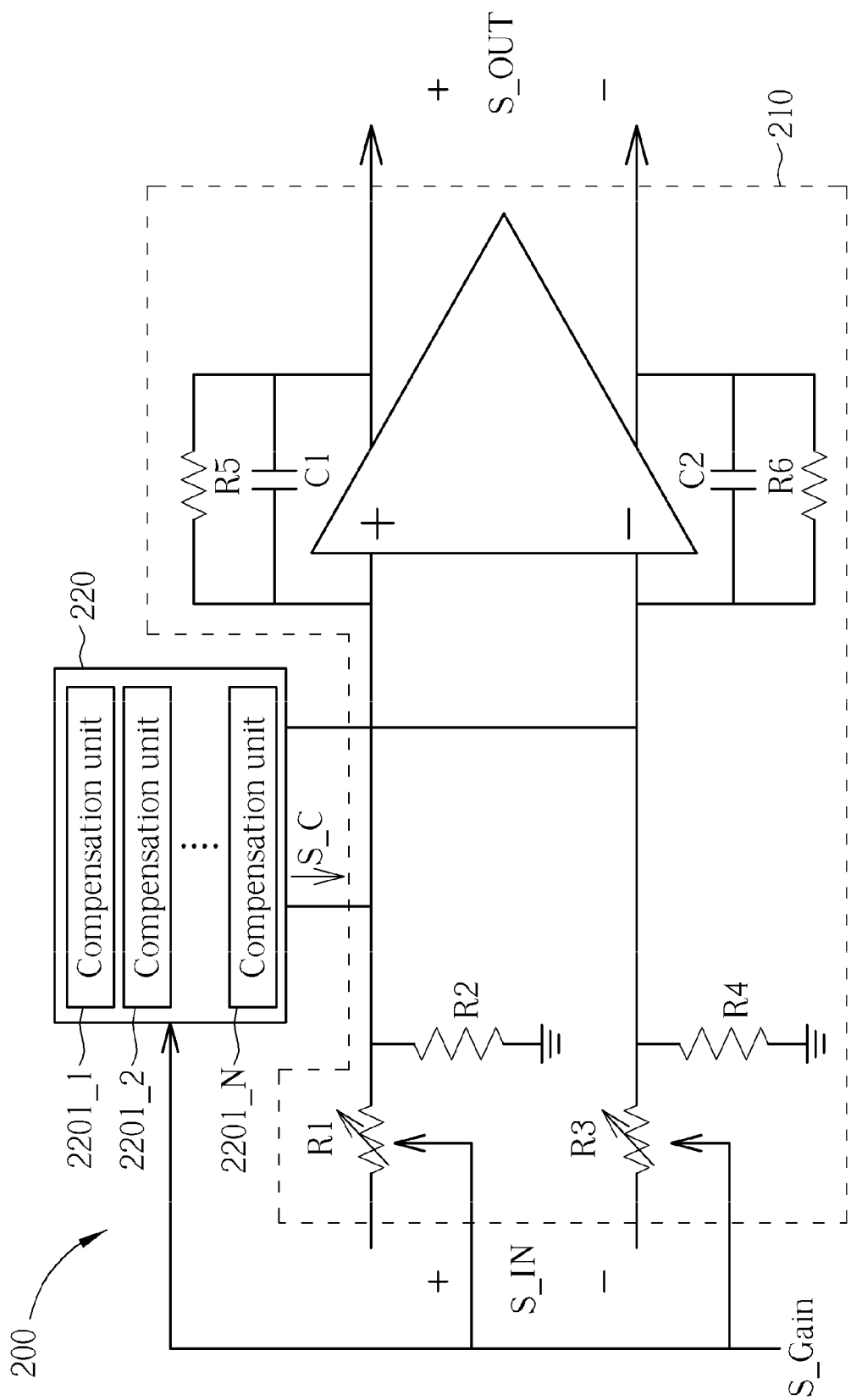
FIG. 2 is a simplified block diagram of a gain stage with DC offset compensation according to one embodiment of the present invention.

A gain stage 200 with DC offset compensation is schematically illustrated in FIG. 2 according to one embodiment of the present invention, which comprises: a gain amplifier 210 and a compensation device 220. The gain amplifier 210 includes resistors R1-R6 and capacitors C1-C2 (please note this architecture is merely one example of the inventive gain amplifier rather than a limitation), and is arranged to amplify an input signal S_IN according to a gain control signal S_Gain. Depending on different embodiments of the present invention, the gain amplifier 210 could be a programmable gain amplifier (PGA) or a variable gain amplifier (VGA). The gain amplifier 210 has a gain G determined by and varied with the gain control signal S_Gain (e.g. it is used to adjust the resistances of variable resistors R1 and R3 to vary the gain G of the gain amplifier 210), and it amplifies the input signal S_IN with the gain G.

There may be other ways of adjusting the gain G in other embodiments of the present invention. The compensation device 220 is arranged to perform a DC offset compensation applied to the gain amplifier 210. In one embodiment, the compensation device 220 generates a compensation signal S_C (which is a current signal in the embodiment; however, it could be a voltage signal or a digital signal in other embodiments) according to an output signal S_OUT at an output of gain amplifier 210, which is then fed to an input of the gain amplifier 210 to compensate the input signal S_IN such that the DC offset interference can be cancelled.

Depending on different embodiments, the DC offset compensation may be performed in a fixed value manner or an adjustable value manner. In the fixed value manner, e.g., for a relatively simple system, the compensation amount indicated by the compensation signal S_C is the same when the DC offset detected at the output signal S_OUT exceeds a threshold to enable the compensation. In the adjustable value manner, the compensation amount indicated by the compensation signal S_C is determined according to the gain control signal S_Gain which corresponds to the output signal S_OUT via an additional detecting circuit (for example, which will be illustrated later), where the compensation amount will be changed with the DC offset detected at the output signal S_OUT. Please note that, although the gain amplifier 210 shown in FIG. 2 is a fully differential type, the embodiment can be altered to other types of amplifier such as a single-ended type, after appropriate modifications are made.

The compensation device 220 includes a plurality of compensation units 2201_1-2201_N, wherein each compensation unit 2201_1-2201_N is able to generate a compensation amount when it is enabled. Because the compensation device 220 would induce the noise, when fewer compensation units of the compensation device 220 are enabled, less noise will be brought to the gain amplifier 210. Hence, in order to reduce the noise caused by compensation device 220, the compensation units 2201_1-2201_N are enabled or selectively enabled only when necessary. For example, if the gain amplifier 210 is operated with a low gain G, fewer compensation units rather than all of them are necessary. If the gain amplifier 210 is operated with a high gain G, however, it is better to enable more compensation units to provide enough compensation for the high gain operation.

In order to achieve this, the compensation device 220 is operated according to different operating configurations depending on the gain G with which the gain amplifier 210 is operated. For example, in a first operating configuration for a low gain G, fewer compensation units will be enabled to generate the compensation signal S_C, which leads to lower noise. In a second operating configuration for a high gain G, more compensation units will be enabled to generate the compensation signal S_C, which leads to more noise but can cancel a larger DC offset due to the high gain G. In short, the enablement of the compensation units 2201_1-2201_N depends on the gain G, and the gain G is further related to the gain control signal S_Gain.

In one embodiment of the present invention, only the compensation unit 2201_1 is selectively enabled according to the gain control signal S_Gain. In this case, the total compensation amount indicated by the compensation signal S_C will be generated by a sum of the compensation amounts provided by compensation units 2201_1~2201_N when the compensation unit 2201_1 is enabled. In another case, the compensation unit 2201_1 is not enabled, and the total compensation amount indicated by the compensation signal S_C will be generated by the compensation amounts provided by a sum of the compensation units 2202_2-2201_N. That is, the compensation device 220 can provide and adaptively adjust the compensation amount by respectively enabling or disabling at least one of the compensation units 2202_2-2201_N, such as by the compensation unit 2201_1.

In other words, if the gain control signal S_Gain indicates a high gate applied, the gain amplifier 210 needs the compensation device 220 to provide a larger compensation amount for covering a possible high DC offset, and the switchable compensation unit 2201_1 will be enabled; otherwise, the switchable compensation unit 2201_1 will not be enabled. It should be noted that the foregoing embodiment is just an exemplary implementation of the present invention. In other embodiments of the present invention, there might be various numbers of compensation units, not as the only one in the foregoing embodiment, can be selectively enabled according to the gain control signal S_Gain. For example, in another embodiment, a group of the compensation units 2201_1-2201_3 and a group of the compensation units 2201_3-2201_7 are selectively enabled according to the gain control signal S_Gain. Such kinds of the implementations can take the gain variation into more detailed consideration, thereby effectively reducing the noise caused by the compensation device 220.

The following description explains how to selectively enable the compensation units 2201_1-2201_N. In the embodiments of the present invention, the enablement of the compensation units 2201_2~2201_N can be controlled according to the gain control signal S_Gain either indirectly or directly. In one embodiment, the gain control signal S_Gain comprises a binary code D (while the gain amplifier 210 might be digitally controlled) and the compensation unit 2201_1 is selectively enabled according to at least one bit of the binary code D. For example, the compensation units 2201_1 can be selectively enabled according to the most significant bit (MSB) of the binary code D. More particularly, if the gain control signal S_Gain is a binary code of 1001, the compensation unit 2201_1 is enabled due to the MSB of 1. Further, when the binary code is 0010, the compensation unit 2201_1 is not enabled due to the MSB of 0.

Figure 3:
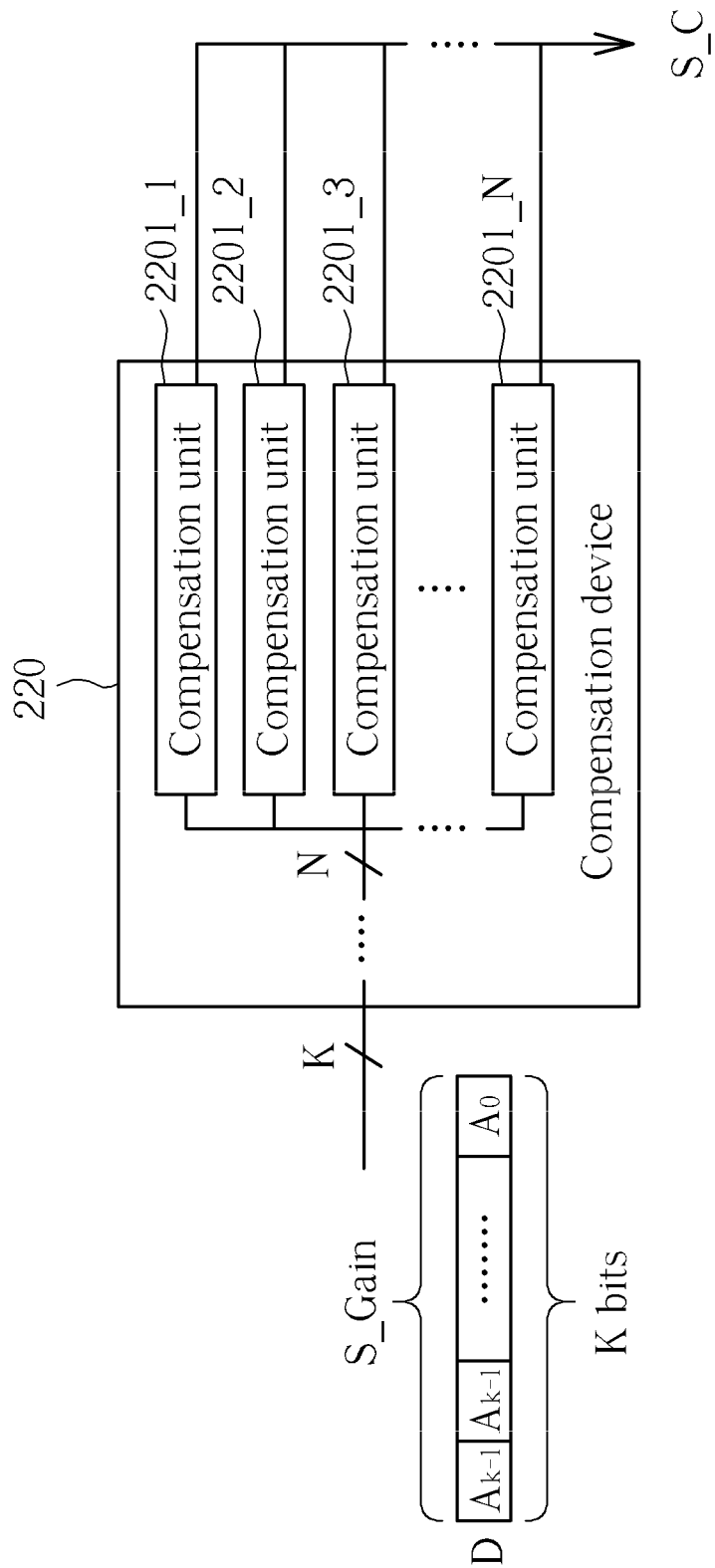
FIG. 3 and FIG. 4 respectively illustrate how to selectively enable the compensation units of FIG. 2 according to one embodiment of the present invention.

In other embodiments, there could be more compensation units controlled according to one bit of the binary code D. For example, if the binary code D consists of bits A3-A0, the compensation unit 2201_1 could be selectively enabled according to A3, the compensation unit 2201_2 could be selectively enabled according to A2, the compensation unit 2201_3 could be selectively enabled according to A1, and the compensation unit 2201_4 could be selectively enabled according to A0. A possible hardware implementation of the abovementioned embodiments is illustrated in FIG. 3. As shown in FIG. 3, the gain control signal S_Gain of K bits which are transmitted via K signal lines (parallel signaling) are respectively used as enable signals of compensation units 2201_1-2201_N, in which K could be greater than, equal to, or smaller than N. That is, all of the following implementations are possible for the present invention: a) all compensation units 2201_1-2201_N are selectively enabled according to bits of the binary code D (K=N); b) only some compensation units 2201_1-2201_N are selectively enabled according to bits of the binary code D (K<N); c) only some bits of the binary code D are used to enable the compensation units 2201_1 -2201_N (K>N).

Figure 4:
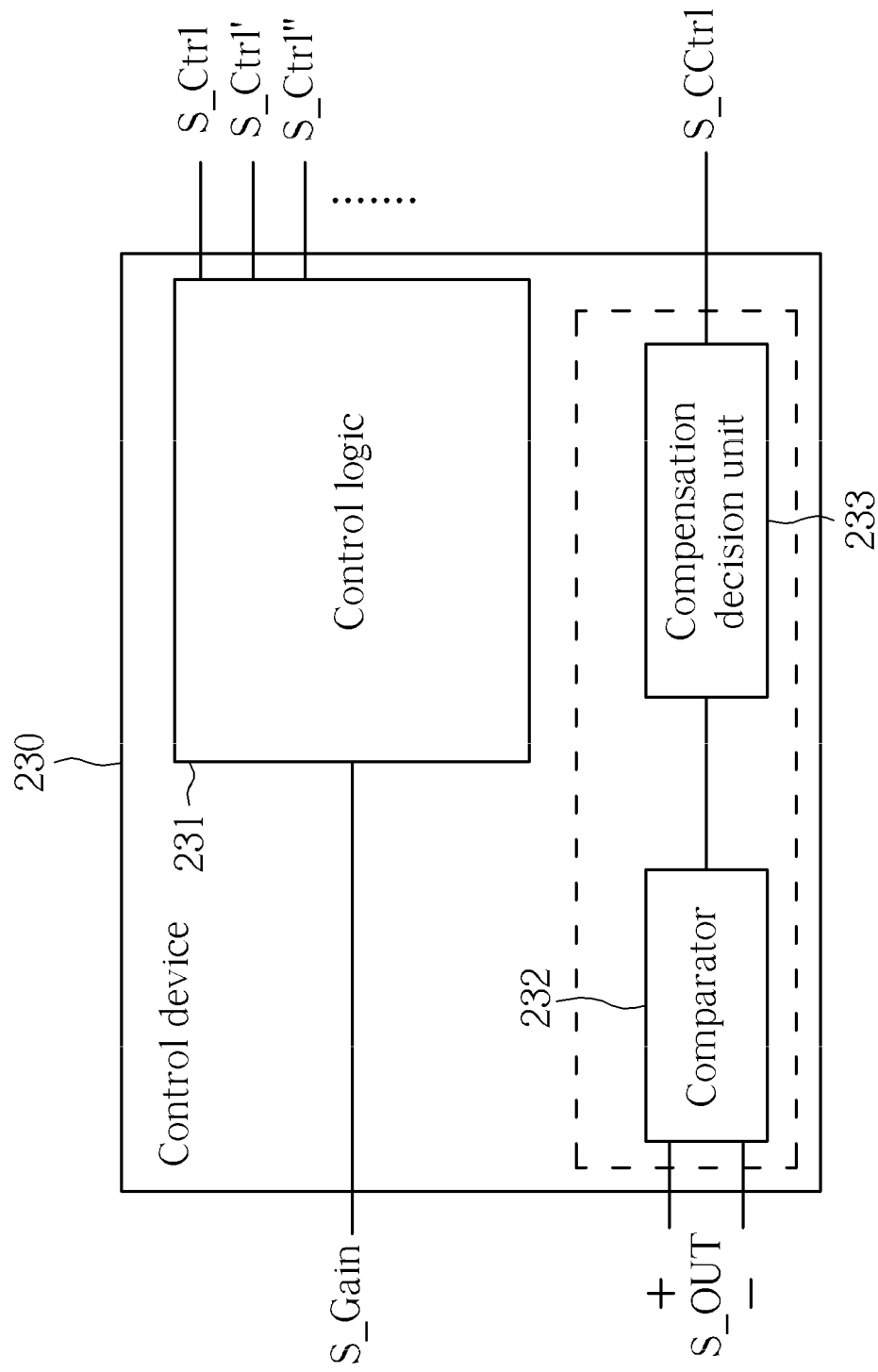

In a further embodiment, the gain stage 200 may employ a control device 230 for determining the enablement of the compensation units 2201_1-2201_N, and this is schematically illustrated in FIG. 4. In this embodiment, the control device 230 is arranged to generate at least a control signal S_Ctrl according to the gain control signal S_Gain, wherein at least one of the compensation units 2201_1-2201_N is selectively enabled according to the control signal S_Ctrl. The control device comprises a control logic 231, and is arranged to decode a binary code of the gain control signal S_Gain, wherein a decoding result of the binary code D is utilized as the control signal S_Ctrl. In this embodiment, the gain control signal S_Gain could be parallel signaling or serial signaling. Based on the number of compensation units which are selectively enabled, there may be more control signals generated, such as S_Ctrl', S_Ctrl'', etc.

In one embodiment, the control device 230 may further comprise a comparator 232 and a compensation decision unit 233 to perform the DC offset compensation in an adjustable value manner. In such a manner, the gain control signal S_Gain is firstly utilized for selectively enabling one or more compensation units 2201_1-2201_N. Once the enablement of the each compensation units 2201_1-2201_N is done, the maximum compensation amount indicated by the compensation signal S_C is accordingly determined. Then, the DC offset at the output signal S_OUT will be detected to determine the operation of each enabled compensation unit. According to the amount of the DC offset detected in the output signal S_OUT, the compensation amount indicated by the compensation signal S_C will be adjusted. For example, in the worst case, the compensation amount indicated by the compensation signal S_C will be adjusted to the maximum amount; otherwise, the compensation amount indicated by the compensation signal S_C is smaller than the maximum amount. To perform the DC offset compensation in the adjustable value manner, a comparator 232 and a compensation decision unit 233 will be utilized. The comparator 232 is coupled to the output of the amplifier 210, and is arranged to detect the DC offset from the output signal S_OUT of the amplifier 210, and accordingly generate a comparison result. The compensation decision unit 233 is coupled to the comparator 232 and the compensation unit 2201_1-2201_N, and arranged to generate at least one compensation control signal S_CCtrl for at least one of the enabled compensation units. In response to the compensation control signal S_CCtrl, the enabled compensation unit(s) which is capable of providing variable compensation amounts will provide a specific compensation amount indicated by the compensation control signal S_CCtrl. Accordingly, a total compensation amount of the enabled compensation unit(s) is determined and provided for cancelling the DC offset.

As known by one of ordinary skill in the art, the IF gain stage of the FM receiver is noise-sensitive no matter whether the gain stage is operated with a high gain or a low gain. The embodiment of the present invention, which can reduce the noise caused to the gain stage operated with low gain, is suitable for the FM receiver application.

Figure 5:
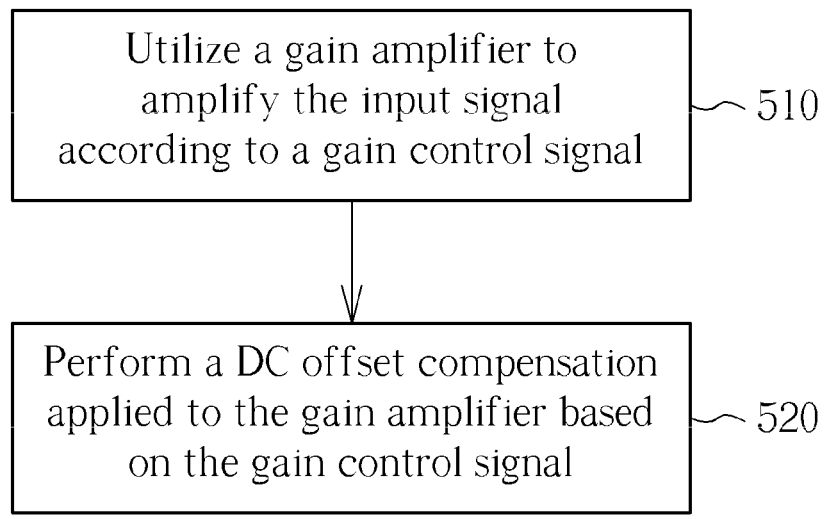
FIG. 5 is a flow chart of an inventive method according to one embodiment of the present invention.
Figure 6:
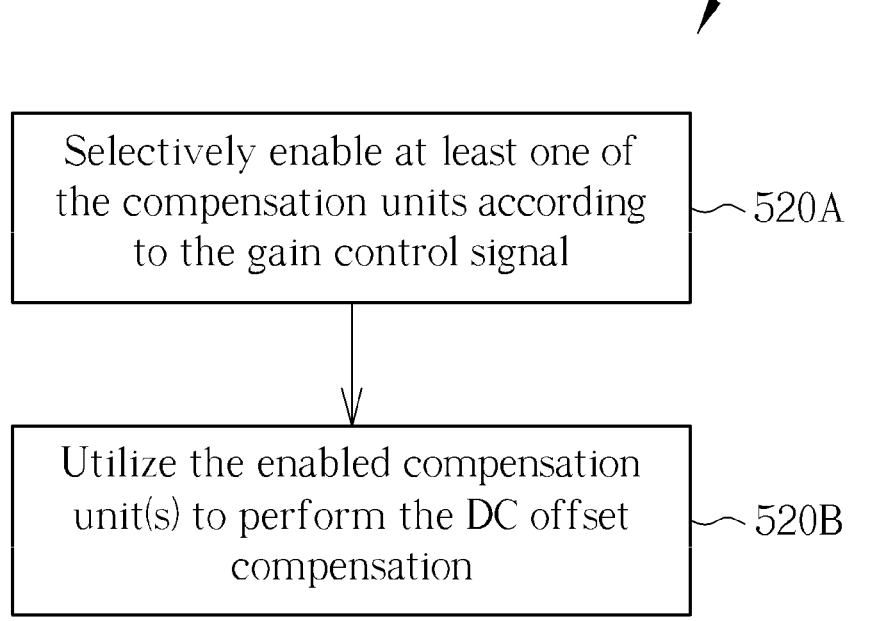
FIG. 6 is a flow chart of an inventive method according to another embodiment of the present invention.

Based on the abovementioned gain stage with DC offset compensation, the embodiments of the present invention further provide a method of amplifying an input signal. A flow chart of the method according to one embodiment of the present invention is illustrated in FIG. 5. In STEP 510, a gain amplifier (e.g. gain amplifier 210) is utilized to amplify an input signal (e.g. S_IN) according to a gain control signal (e.g. S_Gain). In STEP 520, a DC offset compensation applied to the gain amplifier is performed based on the gain control signal. As explained above, the DC offset compensation utilizes one or more compensation units (e.g. compensation units 2201_1-2201_N) to generate a compensation signal. Therefore, in one embodiment as shown in FIG. 6, STEP 520 comprises: STEP 520A) selectively enabling at least one of the compensation units according to the gain control signal; and STEP 520B) utilizing the enabled compensation unit(s) to perform the DC offset compensation. Further, in one embodiment of the present invention, when the gain control signal comprises a binary code, STEP 520A comprises selectively enabling at least one compensation unit according to at least one bit of the binary code. For example, an MSB of the binary code is used to enable at least one compensation unit.

In another embodiment similar to the embodiment illustrated in FIG. 4, a device is used to process the gain control signal so as to generate a signal for selectively enabling at least one of the compensation units. Hence, the method may further comprise steps of generating a control signal according to the gain control signal; and selectively enabling at least one of the compensation units according to the control signal. In one embodiment, during the use of the device to process the gain control signal, the method executes steps of decoding a binary code of the gain control signal; and selectively enabling at least one of the compensation units according to a result of decoding the binary code. Since the method is performed based on the concept of the gain stage as explained above, further detailed descriptions are omitted for the sake of brevity.

Figure 7:
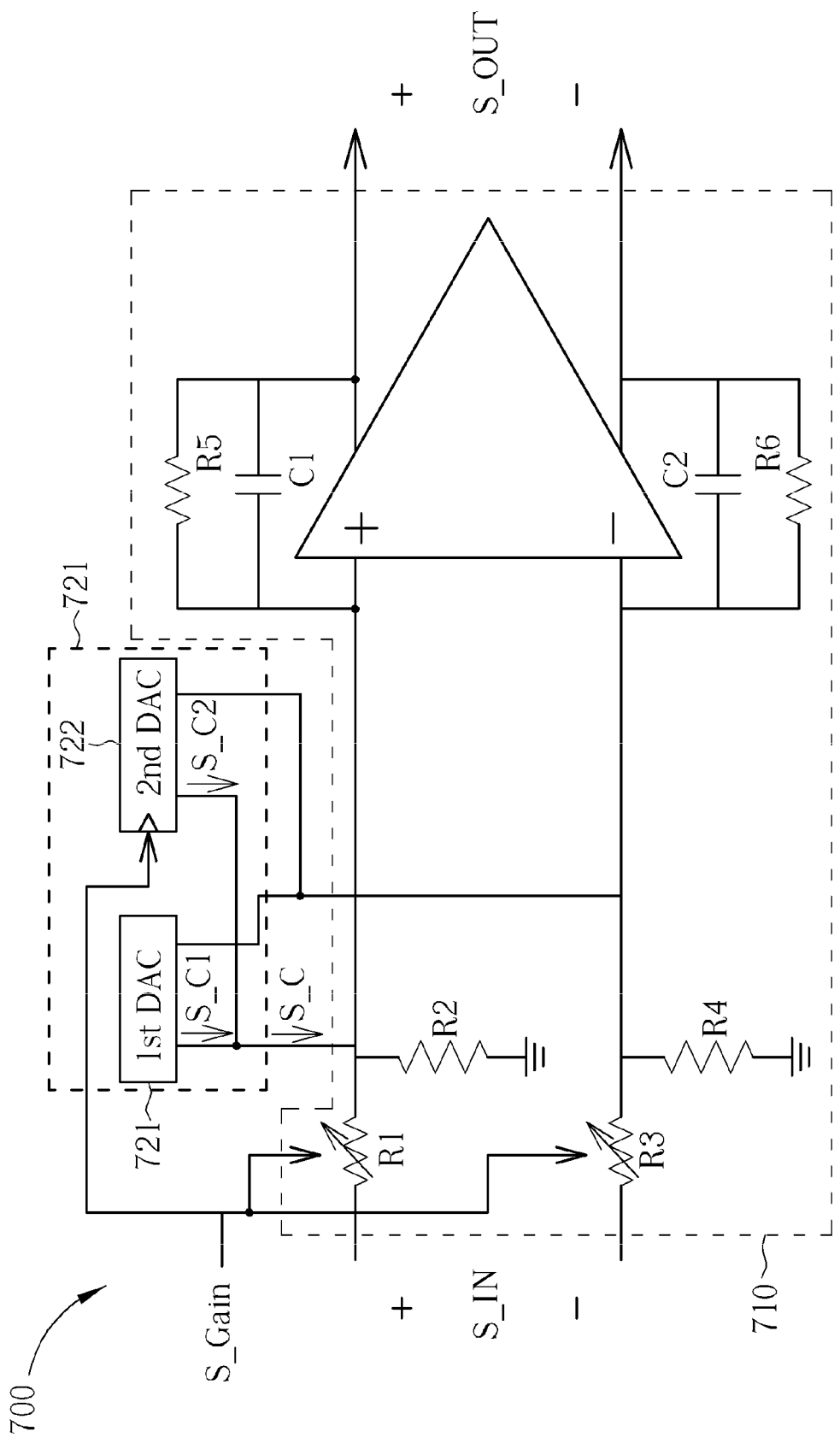
FIG. 7 is a simplified block diagram of a gain stage with DC offset compensation according to still another embodiment of the present invention.

In still another embodiment of the present invention, a gain stage is provided, in which a digital-to-analog converter is adopted to provide a compensation amount for the DC offset, which is schematically illustrated in FIG. 7. A gain stage 700 with DC offset compensation comprises: a gain amplifier 710 and a compensation device 720. The gain amplifier 710 is arranged to amplify an input signal SIN according to a gain control signal S_Gain. The gain amplifier 710 includes resistors R1-R6 and capacitors C1-C2 (please note that this architecture is merely one embodiment of the gain amplifier and not a limitation). A gain G of the gain amplifier 710 varies with the resistances of variable resistors R1 and R3, which are adjusted according to the gain control signal S_Gain. In other embodiments, however, when the gain amplifier 710 has a different architecture, the gain G will be adjusted in a different way.

The compensation device 720 is arranged to perform a DC offset compensation applied to the gain amplifier 710. Further, the compensation device 720 includes: a first DAC 721 and a selectively-enabled second DAC 722. The first DAC 721 is arranged to generate a first compensation signal S_C1 for the DC offset compensation while the second DAC 322 is arranged to generate a second compensation signal S_C2 for the DC offset compensation when it is enabled. When the second DAC 322 is enabled, a compensation signal S_C generated by the compensation device 720 for reducing the DC offset will be formed by the first compensation signal S_C1 and second compensation signal S_C2; otherwise, the compensation signal S_C will be formed by the first compensation signal S_C1 only.

Figure 8:
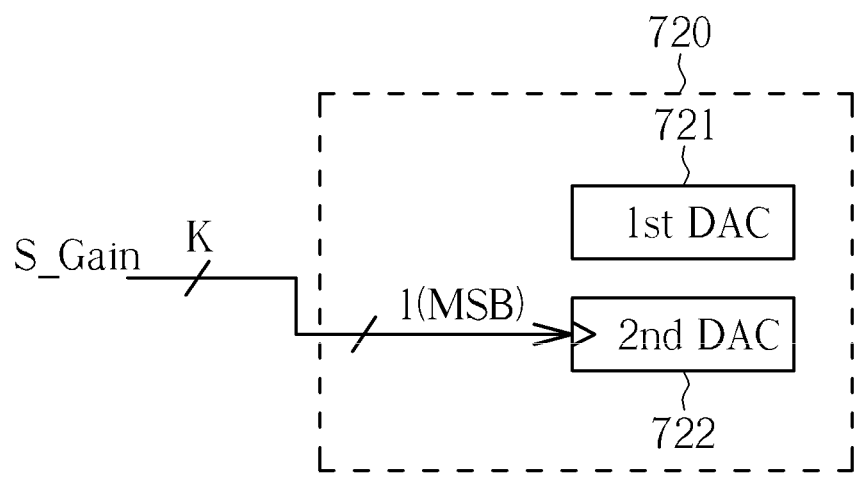
FIG. 8 illustrates how to selectively enable a second DAC of FIG. 7 according to one embodiment of the present invention.
Figure 8:
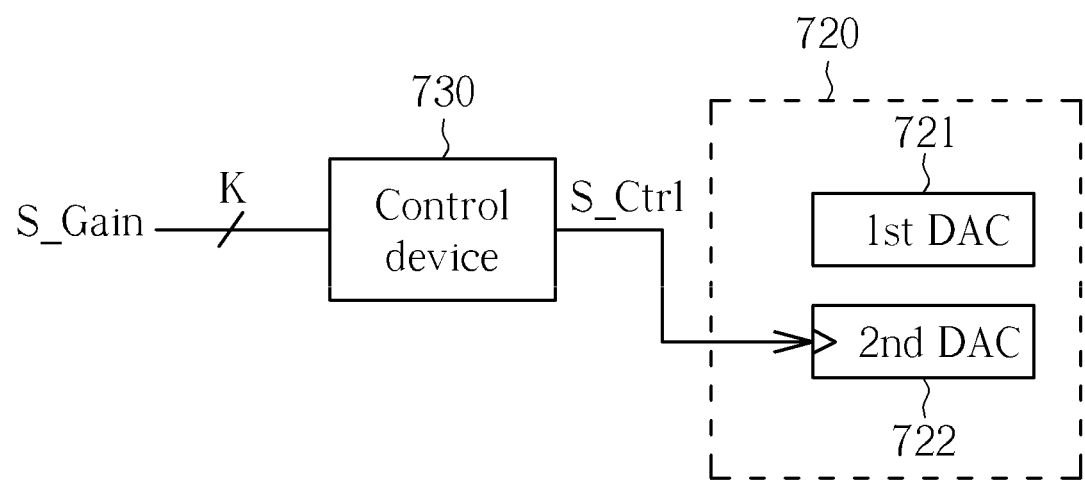

For the purpose of reducing the noise caused to the gain amplifier 710, the second DAC 722 is enabled only when necessary. In one embodiment, when the gain G is greater than or equal to one half of the maximum gain of the gain amplifier 710, the gain G is considered to be high, and therefore the second DAC 722 is enabled. When the gain G is smaller than one half of the maximum gain of the gain amplifier 710, the gain G is considered to be low, and therefore the second DAC 722 is not enabled in order to reduce the noise caused by the compensation device 720. In different embodiments, the enablement of the second DAC 722 is determined in different ways, which is illustrated in FIG. 8. In the upper part of FIG. 8, a binary code D (e.g. K bits) of the gain control signal S_Gain is directly used to enable the second DAC 722, wherein an MSB (e.g. $A_{K-1}$) of the binary code D selectively enables the second DAC 722. In the lower part of FIG. 8, a control device 730 is used to generate a control signal S_Ctrl according to the gain control signal S_Gain. Specifically, the control device 730 may comprise a control logic 731. The control logic 731 is arranged to decode the binary code D of the gain control signal S_Gain, wherein a result of decoding the binary code D is used to determine the control signal S_Ctrl.

As explained above, the control device 730 may further comprise a comparator and a compensation decision unit (not shown) to perform the DC offset compensation in the adjustable value manner. The comparator is coupled to the output of the amplifier 710, and arranged to detect the DC offset from the output signal S_OUT of the amplifier 710, and accordingly generate a comparison result. The compensation decision unit is coupled to the comparator and the first DAC 721 and the second DAC 722, and arranged to generate at least one compensation control signal S_CCtrl for at least one of the first DAC 721 and the second DAC 722 in order to determine a total compensation amount of the compensation device 720 for cancelling the DC offset.

Figure 9:
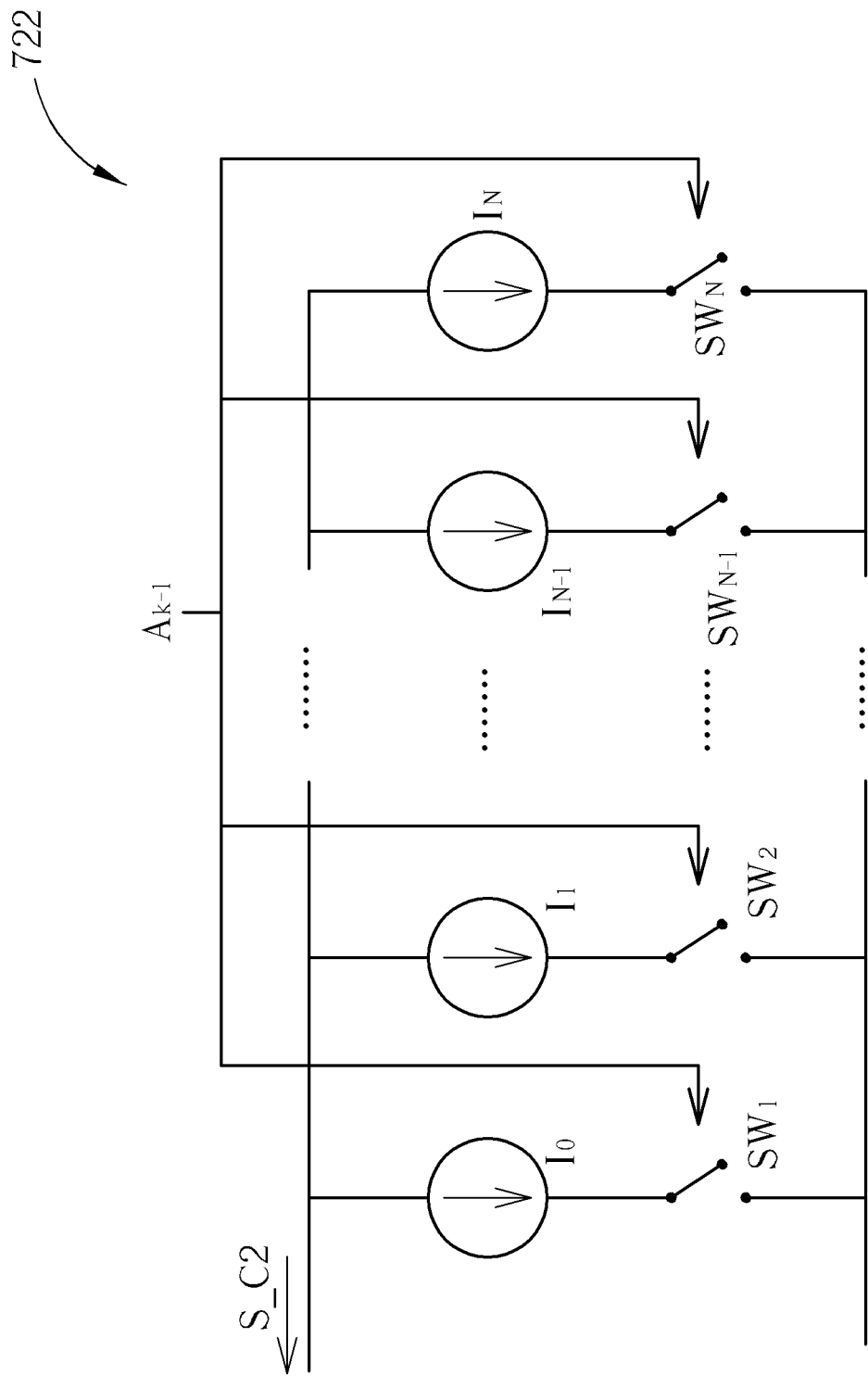
FIG. 9 illustrates a schematic diagram of a second DAC of FIG. 7 according to one embodiment of the present invention.

In one embodiment, the second DAC may be a current steering DAC, as illustrated in FIG. 9. As can be seen from FIG. 9, the second DAC 722 has a plurality of current sources $I_0$-$I_N$, which are respectively controlled by a plurality of switches $SW_0$-$SW_N$. The switches $SW_0$-$SW_N$ may be controlled by a controller, such as the compensation decision unit 233 of FIG. 4. Based on the detected DC offset, the second DAC 722 generates the proper second compensation signal S_C2 according to a compensation control signal S_CCtrl. For example, the compensation control signal S_CCtrl can be a digital signal consisting of a binary code, and bits of the binary code are used to control the switches $SW_0$-$SW_N$. In order not to enable the second DAC 722 when the gain G of the gain amplifier 710 is smaller than one half of the maximum gain, the switches $SW_0$-$SW_N$ are also controlled by the MSB of the gain control signal S_Gain, wherein the MSB of 0 will switch off all switches $SW_0$-$SW_N$, such that current sources $I_0$-$I_N$ do not generate current. As a consequence, the compensation amount indicated by the second compensation signal S_C2 will be '0'. Further, in the case where the control signal is used to enable the second DAC 722, the switches $SW_0$-$SW_N$ will be controlled by the control signal S_Ctrl rather than the MSB of the gain control signal S_Gain.

Reference in the specification to "one embodiment" or "an embodiment" means that a particular feature, structure, or characteristic described in connection with the embodiment is included in at least an implementation. The appearances of the phrase "in one embodiment" in various places in the specification are not necessarily all referring to the same embodiment. Thus, although embodiments have been described in language specific to structural features and/or methodological acts, it is to be understood that claimed subject matter may not be limited to the specific features or acts described. Rather, the specific features and acts are disclosed as sample forms of implementing the claimed subject matter.

In conclusion, the present invention can reduce the noise caused by the DC offset compensation device by considering the gain with which the gain amplifier is currently operated and configuring the DC offset compensation device accordingly. As a result, the present invention reduces the noise as much as possible.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A gain stage with DC offset compensation, comprising:
   a gain amplifier, arranged to amplify an input signal according to a gain control signal; and
   a compensation device, arranged to perform a DC offset compensation applied to the gain amplifier with an operating configuration based on the gain control signal, comprising:
   a plurality of compensation units, at least one of the compensation units being selectively enabled according to the gain control signal, wherein the enabled compensation unit(s) performs the DC offset compensation;
   wherein when the gain control signal has a first gain value, a number of the enabled compensation units is equal to a first value, and when the gain control signal has a second gain value different from the first gain value, a number of the enabled compensation units is equal to a second value different from the first value.

2. The gain stage with DC offset compensation of claim 1, wherein the gain control signal comprises a binary code, and the at least one of the compensation units is selectively enabled according to at least one bit of the binary code.

3. The gain stage with DC offset compensation of claim 1, further comprising:
   a control device, arranged to generate a control signal according to the gain control signal, wherein the at least one of the compensation units is selectively enabled according to the control signal.

4. The gain stage with DC offset compensation of claim 3, wherein the control device comprises:
   a control logic, for decoding a binary code of the gain control signal, wherein the at least one of the compensation units is selectively enabled according to a result of decoding the binary code.

5. The gain stage with DC offset compensation of claim 1, being utilized in an FM receiver.

6. The gain stage with DC offset compensation of claim 1, wherein the operating configuration is determined based on the gain control signal.

7. A method of amplifying an input signal, comprising:
   utilizing a gain amplifier to amplify the input signal according to a gain control signal; and
   performing a DC offset compensation applied to the gain amplifier based on the gain control signal, comprising:
   selectively enabling at least one of the compensation units according to the gain control signal; and
   utilizing the enabled compensation unit(s) to perform the DC offset compensation;
   wherein when the gain control signal has a first gain value, a number of the enabled compensation units is equal to a first value, and when the gain control signal has a second gain value different from the first gain value, a number of the enabled compensation units is equal to a second value different from the first value.

8. The method of claim 7, wherein the gain control signal comprises a binary code, and the step of selectively enabling the at least one of the compensation units comprises:

selectively enabling the at least one of the compensation units according to at least one bit of the binary code.

9. The method of claim 7, further comprising:
generating a control signal according to the gain control signal; and
selectively enabling the at least one of the compensation units according to the control signal.

10. The method of claim 9, wherein the step of selectively enabling the at least one of the compensation units comprises:
decoding a binary code of the gain control signal; and
selectively enabling the at least one of the compensation units according to a result of decoding the binary code.

11. A gain stage with DC offset compensation, comprising:
a gain amplifier, arranged to amplify an input signal according to a gain control signal;
a compensation device, arranged to perform a DC offset compensation applied to the gain amplifier, comprising:
a first digital-to-analog converter (DAC), arranged to generate a first compensation signal for the DC offset compensation; and
a second DAC, being selectively enabled according to the gain control signal, and arranged to generate a second compensation signal for the DC offset compensation when enabled.

12. The gain stage with DC offset compensation of claim 11, wherein the second DAC is enabled if the gain control signal indicates the gain amplifier is operated at a gain greater than or equal to one half of a maximum gain of the gain amplifier, and the second DAC is not enabled if the gain control signal indicates the gain amplifier is operated at a gain smaller than one half of the maximum gain of the gain amplifier.

13. The gain stage with DC offset compensation of claim 11, wherein the gain control signal comprises a binary code, and the second DAC is selectively enabled according to a most significant bit of the binary code.

14. The gain stage with DC offset compensation of claim 11, further comprising:
a control device, arranged to generate a control signal according to the gain control signal, wherein the second DAC is selectively enabled according to the control signal.

15. The gain stage with DC offset compensation of claim 14, wherein the control device comprises:
a control logic, for decoding a binary code of the gain control signal wherein the second DAC is selectively enabled according to a result of decoding the binary code.

16. The gain stage with DC offset compensation of claim 11, wherein the second DAC is a current-steering DAC, and comprises:
a plurality of current sources, respectively coupled to a plurality of switches, wherein when the second DAC is not enabled, the switches will be turned off, such that the current sources do not generate current.

* * * * *